(12) United States Patent
Kado et al.

(10) Patent No.: US 7,959,385 B2
(45) Date of Patent: Jun. 14, 2011

(54) PRINTED CIRCUIT BOARD MACHINING APPARATUS

(75) Inventors: Hirofumi Kado, Ebina (JP); Hiroyuki Kamata, Ebina (JP); Shintaro Takahashi, Ebina (JP); Katsuhiro Nagasawa, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 582 days.

(21) Appl. No.: 12/153,591

(22) Filed: May 21, 2008

(65) Prior Publication Data

US 2008/0292416 A1 Nov. 27, 2008

(30) Foreign Application Priority Data

May 24, 2007 (JP) .................................. 2007-138281

(51) Int. Cl.
*B23B 41/00* (2006.01)
(52) U.S. Cl. ........................................... 408/97; 408/98
(58) Field of Classification Search .................... 408/95, 408/97, 98, 103, 8; *B23B 41/00, 47/28*
See application file for complete search history.

(56) References Cited

U.S. PATENT DOCUMENTS 5,876,156 A * 3/1999 Yamaura et al. ................ 408/95

FOREIGN PATENT DOCUMENTS

| JP | 04041112 A | * | 2/1992 |
| JP | 04354609 A | * | 12/1992 |
| JP | 08-010480 | | 1/1996 |
| JP | 08168932 A | * | 7/1996 |
| JP | 09136299 A | * | 5/1997 |
| JP | 09267298 A | * | 10/1997 |
| JP | 10286736 A | * | 10/1998 |
| JP | 2000334697 A | * | 12/2000 |

OTHER PUBLICATIONS

Chinese Office Action issued Feb. 1, 2011 in corresponding Application No. 200810097733.6 . (with English translation).

* cited by examiner

*Primary Examiner* — Daniel W Howell
(74) *Attorney, Agent, or Firm* — Wenderoth, Lind & Ponack, L.L.P.

(57) ABSTRACT

A printed circuit board machining apparatus includes a spindle that holds a tool for machining a printed circuit board and a pressure unit for pressing the printed circuit board to a table in machining the printed circuit board. The pressure unit includes a pressure foot movable up an down along the spindle, a rotating member having a plurality of pressure pieces through which a through hole for passing the tool is formed and provided so as to select one among the plurality of pressure pieces, a motor for moving the rotating member, cylinders and electromagnetic valves for moving the pressure foot up and down and a control section for controlling the cylinders and electromagnetic valves. The control section rotates the motor so as to select the pressure piece and controls the cylinders and the electromagnetic valves to change force for pressing the printed circuit board.

3 Claims, 3 Drawing Sheets

PRINTED CIRCUIT BOARD MACHINING APPARATUS

BACKGROUND OF THE INVENTION

1. Field of the Invention

The present invention relates to a printed circuit board machining apparatus.

2. Description of Related Art

Hithertofore, a tool (drill) has been used in general to drill holes on a printed circuit board (referred to as a "workpiece" hereinafter) by a printed circuit board machining apparatus. Although the tool receives pressing force in a direction along an axial line of the tool in this case, it barely receives force in a direction intersecting with the axial line. Therefore, the printed circuit board machining apparatus can drill holes of small diameter (e.g., about 0.1 mm) at high speed without enhancing rigidity of the tool in the direction intersecting with the axial line of the tool.

However, there is a case when burr is generated around the machined holes. Then, a countermeasure is taken so as to prevent the burr from being generated by placing an upper plate on an upper side of the workpiece and by pressing a vicinity of a part of the workpiece where a hole is to be perforated by a pressure unit before cutting into the workpiece by the tool.

Note that JP1992-354609A discloses a pressure unit having a plurality of pressure pieces and arranged so as to select the pressure piece in accordance to a diameter of a tool to be used for machining and to press the workpiece by that pressure piece.

Still more, a milling tool is used in machining grooves and profiles (referred to as "groove and profile machining" hereinafter) to a workpiece by a printed circuit board profile machining apparatus. The tool receives pressing force in a direction along an axial line of the tool and force in a direction orthogonal to the axial line in this case. Therefore, although a structure of the printed circuit board profile machining apparatus is substantially the same with the printed circuit board machining apparatus described above, the rigidity of the tool in the direction orthogonal to the axial line of the tool is enhanced so as to be able to sustain a load in the orthogonal direction.

While the workpiece is pressed to a table in machining the workpiece, a measure is taken so as to prevent a surface of the workpiece from being damaged by adopting a brush as a workpiece pressure unit because the tool and the workpiece (table) are relatively moved from each other in a horizontal direction in a state when the tool is cutting the workpiece in case of the printed circuit board profile machining apparatus. Although normally there is provided only one brush, some apparatus is provided with double brushes as disclosed in JP1996-10480U. It is noted that the printed circuit board profile machining apparatus is also capable of machining holes on the workpiece. Hereinafter, the printed circuit board drilling apparatus and the printed circuit board profile machining apparatus are collectively called also as a printed circuit board machining apparatus.

In recent years, however, thickness of the workpiece is reduced more and more. Therefore, because a thin workpiece has less rigidity, it has become necessary to press the workpiece in a vicinity of a tool. However, force for pressing the workpiece to the table by the pressure piece of the printed circuit board machining apparatus of the past is constant regardless of a type and diameter of the tool.

Therefore, it has been difficult to accurately machine grooves and profiles on the thin workpiece by the printed circuit board profile machining apparatus of the past.

Accordingly, there is a need for providing a printed circuit board machining apparatus arranged so as to be able to accurately machine grooves and profiles on a printed circuit board by adjusting pressing force for pressing the printed circuit board corresponding to the type and diameter of a tool.

SUMMARY OF THE INVENTION

There is provided a printed circuit board machining apparatus, including a table, a spindle rotatable and movable up and down while holding a tool for machining a printed circuit board mounted on the table and a pressure unit for pressing the printed circuit board to the table in machining the printed circuit board, wherein the pressure unit including an elevating member movable up and down along the spindle, a moving member having a plurality of pressure pieces each having a through hole formed to pass through the tool, configured so as to allow one among the plurality of pressure pieces to be selected and held by the elevating member, a driving section for moving the moving member so that the through hole of the pressure piece is aligned with an axial center of the tool, an elevation driving section for moving the elevating member up and down to press the selected pressure piece to the printed circuit board and a control section for controlling the driving section and the elevation driving section. The control section controls the driving section so that it selects the pressure piece in accordance to a type and diameter of the tool and controls the elevation driving section so as to change force for pressing the printed circuit board corresponding to the selected pressure piece.

The printed circuit board machining apparatus of the invention described above is capable of machining the grooves and holes efficiently and accurately on a printed circuit board because the control section controls the elevation driving section so as to change the force for pressing the printed circuit board corresponding the selected pressure piece.

The above and other advantages of the invention will become more apparent in the following description and the accompanying drawings in which like numerals refer to like parts.

PREFERRED EMBODIMENT OF THE INVENTION

A printed circuit board machining apparatus of the invention will be explained below based on the drawings.

Figure 1:
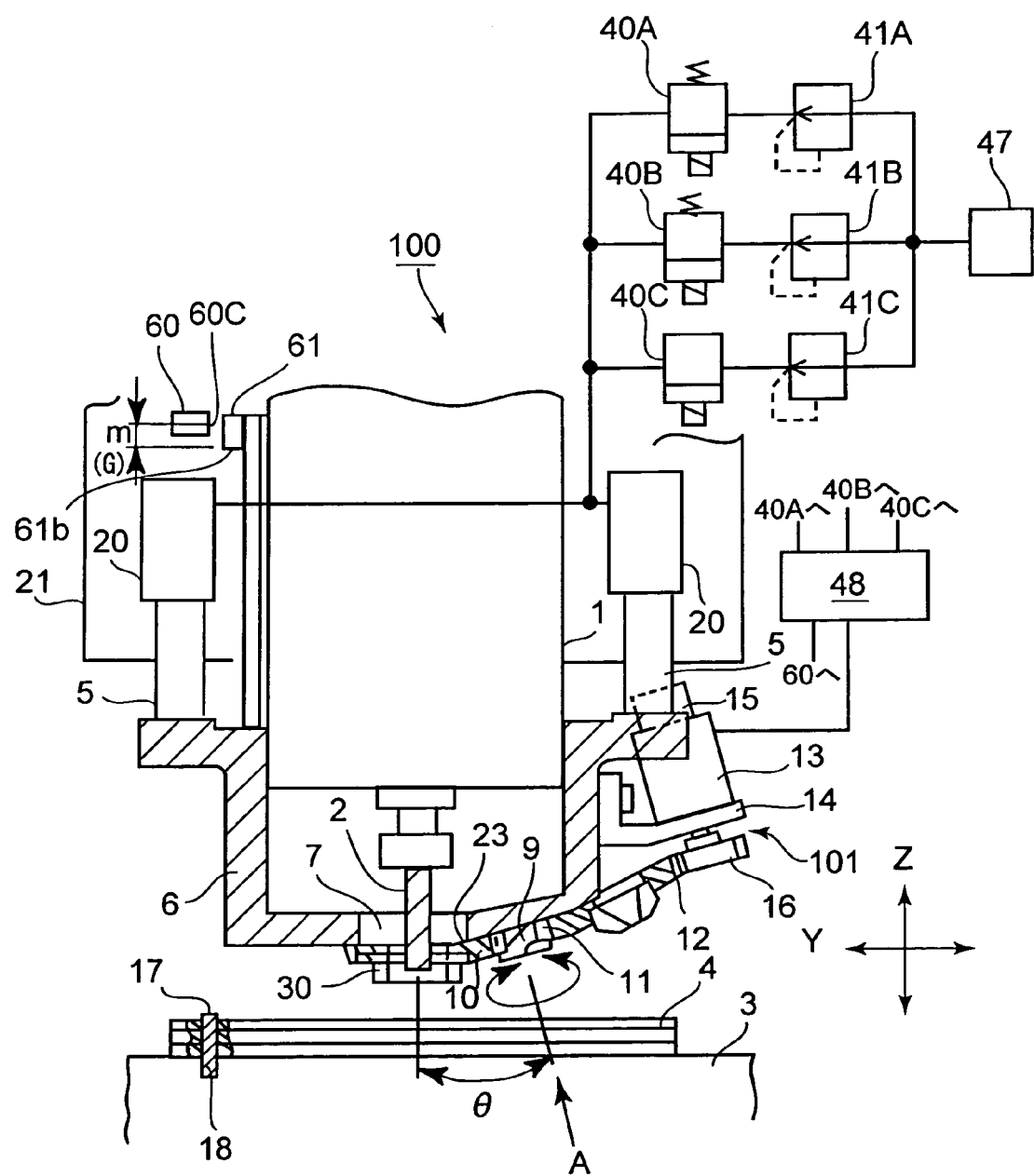
FIG. 1 is a schematic front section view of a printed circuit board machining apparatus according to an embodiment of the invention.
Figure 2:
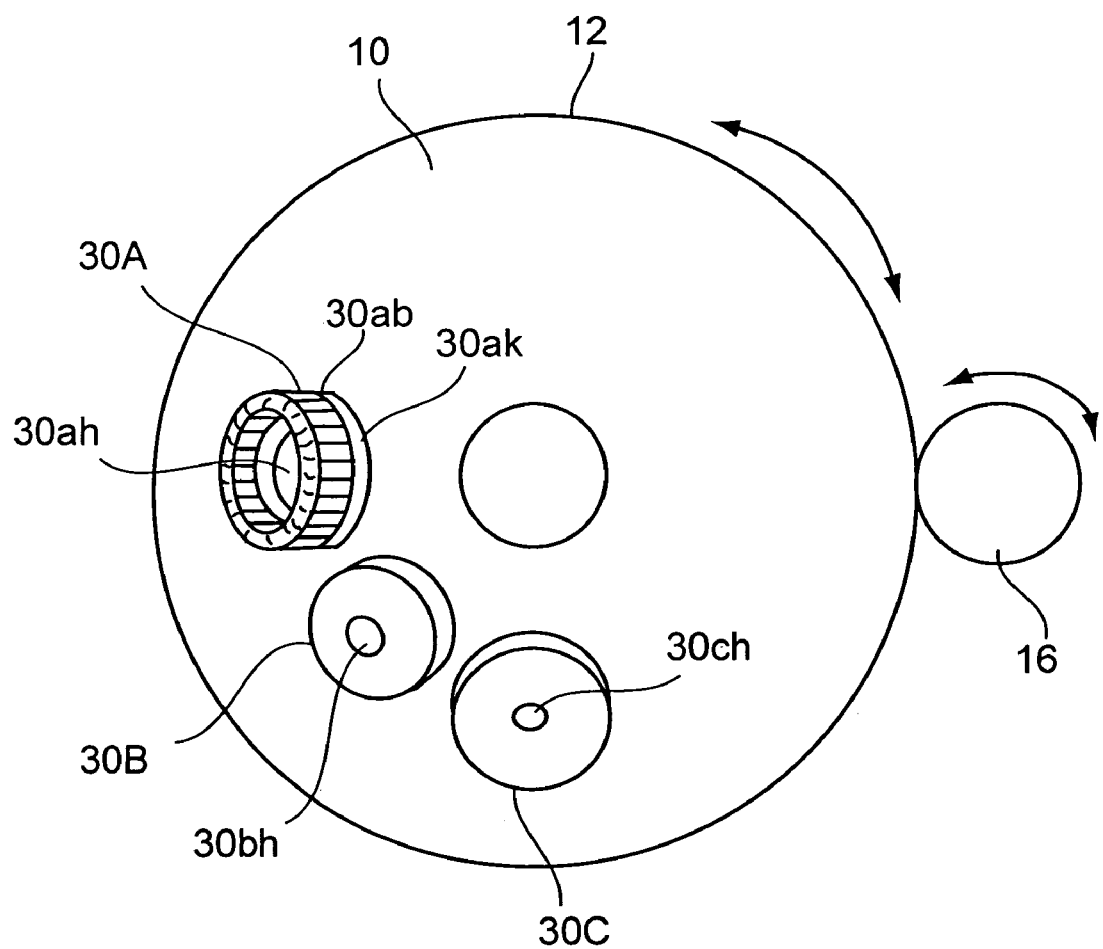
FIG. 2 is a view of FIG. 1 seen from an arrow A.
Figure 3A:
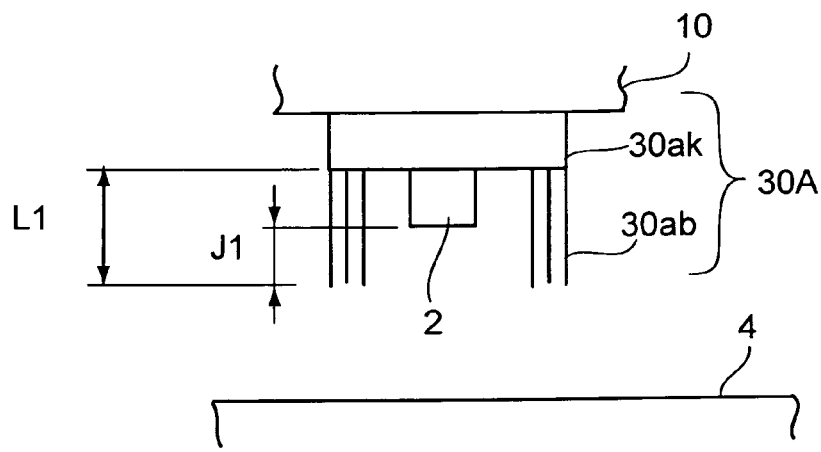
FIGS. 3A, 3B and 3C are diagrams for explaining operations of a pressure piece of the invention.
Figure 3B:
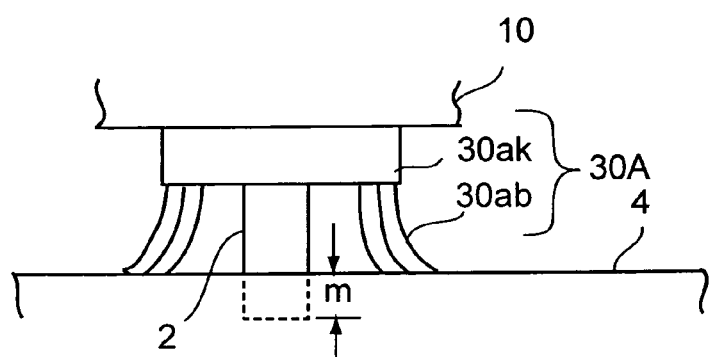
Figure 3C:
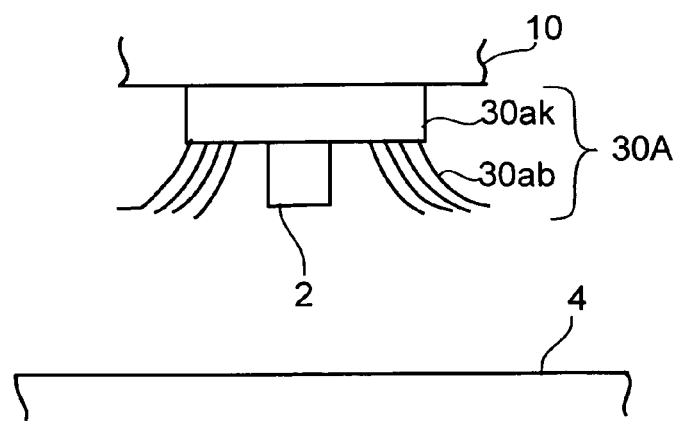

FIG. 1 is a schematic front section view of the printed circuit board machining apparatus according to an embodiment of the invention, FIG. 2 is a view of FIG. 1 seen from an arrow A and FIGS. 3A, 3B and 3C are diagrams for explaining an operation of a pressure piece of the printed circuit board machining apparatus of the invention.

The printed circuit board machining apparatus 100 is arranged so as to be able to machine grooves, profiles and holes on a workpiece 4. It is noted that an under plate is always disposed under the workpiece to prevent a table for mounting the workpiece from being damaged in machining the grooves, profiles and holes.

The printed circuit board machining apparatus 100 holds a tool 2 removably by a cylindrical spindle 1. The spindle 1 is fixed to a Z-table 21. The Z-table 21 is supported movably in a vertical direction (in a direction of an arrow Z) by a slider not shown that is movable in a direction of an arrow Y.

The printed circuit board machining apparatus 100 is provided with a pressure unit 101 for pressing the workpiece to the table before and during machining the workpiece. The pressure unit 101 includes a pressure foot 6, cylinders 20, a rotating member 10, a pressure piece 30, a motor 13, 2-port electromagnetic valves 40A, 40B and 40C (generically referred to as "40" hereinafter), a control section 48 and others.

The pressure foot 6 is fitted into an edge portion of the spindle 1 slidably in parallel with an axial line of the drill 2 and is supported by rods 5.

A through hole 7 through which the drill 2 passes through is formed at an axial center part of the pressure foot 6. The rods 5 are coupled with the cylinders 20 that are disposed in parallel with the spindle 1. The Z-table 21 supports the cylinders 20.

The rotating member 10 is rotatably supported by a support shaft 9 through an intermediary of a bearing 11. The support shaft 9 projects from the pressure foot 6 while inclining by an angle θ with respect to the axial center of the pressure foot 6. A surface 23 of the pressure foot 6 that contacts the rotating member 10 is formed as a surface of a cone that is convex downward and whose generatrix is orthogonal to the axial line of the pressure foot 6. A surface of the rotating member 10 that contacts the pressure foot 6 is formed as a concave that contacts the surface of the cone. A gear tooth 12 is formed around a periphery of the rotating member 10.

The pressure foot 6 also supports the motor 13 through an intermediary of a bracket 14. The motor 13 is attached with an encoder 15. A gear 16 that engages with the gear tooth 12 is attached to an output shaft of the motor 13.

As shown in FIG. 2, n pieces of pressure pieces 30 (30A, 30B, 30C . . . ) are disposed on the rotating member 10. The pressure piece 30A is composed of a ringed base 30$ak$ made of synthetic resin or metal and a fibrous member 30$ab$ that is implanted to an edge of the base 30$ak$. A through hole 30$ah$ used is formed at a center part of the base 30$ak$. Hairs, nylon and the like are adopted as the fibrous member 30$ab$ so as to barely damage the workpiece when it moves on the workpiece together with the tool. The fibrous member 30$ab$ also prevents chips of the workpiece from flying around it. The pressure piece 30A is used in machining grooves and will be referred to as a brush 30A hereinafter. The pressure piece 30B and 30C are also made of synthetic resin or metal and have through holes 30$bh$ and 30$ch$ at center parts thereof, respectively.

The cylinders 20 are connected respectively to output sides of the 2-port electromagnetic valves 40 (40A, 40B and 40C). Input sides of the respective two-port electromagnetic valves 40 are connected to an output side of a compressor 47 via pressure reducing valves 41A, 41B and 41C (generically denoted as "41" hereinafter). By the way, urging force, i.e., force for pressing the workpiece or pressing force, of the pressure foot 6 is set to be 2 kg, 5 kg and 10 kg, respectively, when the 2-port electromagnetic valves 40A, 40B and 40C are turned ON in case of the present embodiment.

Dogs 61 are disposed around a periphery of the pressure foot 6. A sensor 60 is disposed on the Z-table 21 and is arranged so that it turns OFF when a lower end 61$b$ of the dog 61 deviates out of a center 60C of the sensor 60.

The table 3 is movable in a direction of X vertical to a sheet showing FIG. 1 (a front and back direction of the sheet). The workpiece 4 is fixed on the table 3 such that a reference pin 17 fixed to the workpiece 4 fits into a reference hole 18 provided on the table 3.

Next, a positional relationship between the sensor 60 and the dog 61 will be explained.

FIGS. 3A, 3B and 3C are diagrams for explaining shapes of the brush 30A in a machining step.

When an end mill 2, i.e., the tool, is in a standby state, an edge of the fibrous member 30$ab$ does not abut against a surface of the workpiece 4 and a distance from an edge of the base 30$ak$ to the edge of the fibrous member 30$ab$, i.e., a length of the fibers, is L1 as shown in FIG. 3A. A distance from an edge of the end mill 2, i.e., the tool, to the edge of the fibrous member 30$ab$ is J1. When the pressure foot 6 urges (presses) the workpiece 4 by the predetermined force set in advance during machining, the fibrous member 30$ab$ deflects as shown in FIG. 3B. Then, when the fibrous member 30$ab$ deforms over processing time into a shape as shown in FIG. 3C in the standby state, the position of the edge of the fibrous member 30$ab$ changes as compared the position thereof shown in FIG. 3A. When the deformation of the edge of the fibrous member 30$ab$ becomes large, it becomes unable to press the workpiece 4 by the brush 30A during machining.

Then, the tool is positioned such that a distance G between the sensor 60 and the lower end 61$b$ of the dog 61 in the standby state is equalized with a cutting depth m by which the tool cuts into the workpiece 4 during the machining.

The control section 48 of the printed circuit board machining apparatus is arranged so as to control the motor 13 and the 2-port electromagnetic valve 40 corresponding to a type and diameter of the tool specified by a processing program and to monitor an output of the sensor 60.

Next, a machining procedure of the embodiment of the invention will be explained. Noted that the present embodiment is set in advance such that the 2-port electromagnetic valve 40A is turned ON when the end mill 2 is selected.

When a purpose of machining specified is a groove, the control section 48 aligns an axial line of the brush 30A to the axial line of the end mill 2, i.e., to the axial line of the spindle 1, in accordance to the processing program after holding the end mill 2, i.e., the tool, by the spindle 1. Next, the control section 48 operates the end mill 2 so as to cut into the workpiece 4 by the specified depth m after turning the 2-port electromagnetic valve 40A ON. Then, when the sensor 60 is OFF, i.e., when the center 60C of the sensor 60 is located under the lower end 61$b$ of the dog 61 and the brush 30A presses the workpiece 4, the control section 48 machines the workpiece in accordance to the machining program after that. Note that when the sensor 60 turns ON during machining, i.e., when the center 60C of the sensor 60 faces to the dog 61 and the brush 30A does not press the workpiece 4, the control section 48 stops the machining after conducting an alarm action for example.

When the purpose of machining specified is a hole, the control section 48 selects the pressure piece 30 (one of pressure pieces 30A, 30B, 30C and so on) suited to a diameter of the drill 2 (those having a through hole whose diameter is larger than the diameter of the drill 2 by about 1 to 2 mm) after holding the drill 2, i.e., a tool having the specified diameter, by the spindle 1 and then aligns an axial line of the selected pressure piece to the axial line of the spindle 1. Next, the control section 48 turns ON the 2-port electromagnetic valve 40B (or the 2-port electromagnetic valve 40C) by making reference to specified pressure. Next, the control section 48 machines the hole by operating the drill 2 so as to cut into the workpiece 4 by the specified depth.

Note that although the case when there is provided one type of brush has been explained above, it is also preferable to prepare a brush having a different length L1, depending on a workpiece. When the distance between the edge of the tool 2 and the edge of the fibrous member 30ab is different from J1 in this case, a dog and a sensor suited to that case may be prepared.

Furthermore, although three sets of electromagnetic valves and pressure reducing valves have been provided above, a number of sets of the 2-port electromagnetic valve 40 and the pressure reducing valve 41 may be reduced to one when the pressure reducing valve is electrically controllable. Still more, although the electromagnetic valves and the pressure reducing valves operate by air, they may be arranged so as to operate hydraulically.

Further, although the distance G has been equalized to the cutting depth m when the tool cuts into the workpiece 4 in the embodiment described above, that value may be a value smaller that the cutting depth m, e.g., "m−1" mm. Still more, when the tool is a drill, it becomes possible to press the workpiece before the drill cuts into the workpiece when the distance G is "L1−1" mm for example.

It will be obvious to those having skill in the art that many changes may be made in the above-described details of the preferred embodiments of the present invention. The scope of the invention, therefore, should be determined by the following claims.

What is claimed:

1. A printed circuit board machining apparatus, comprising:
    a table;
    a spindle rotatable and movable up and down while holding a tool for machining a printed circuit board mounted on the table; and
    a pressure unit for pressing the printed circuit board to the table in machining the printed circuit board;
    wherein the pressure unit, comprising:
        an elevating member movable up and down along the spindle;
        a moving member having a plurality of pressure pieces each having a through hole formed to pass through the tool, configured so as to allow one among the plurality of pressure pieces to be selected and held by the elevating member;
        a driving section for moving the moving member so that the through hole of the pressure piece is aligned with an axial center of the tool;
        an elevation driving section for moving the elevating member up and down to press the selected pressure piece to the printed circuit board; and
        a control section for controlling the driving section and the elevation driving section;
        wherein the control section controlling the driving section so as to select the pressure piece in accordance to a type and diameter of the tool and controlling the elevation driving section so as to change force for pressing the printed circuit board corresponding to the selected pressure piece.

2. The printed circuit board machining apparatus according to claim 1, wherein at least one pressure piece among the plurality of pressure pieces has a ringed brush for pressing the printed circuit board.

3. The printed circuit board machining apparatus according to claim 1, further comprising a detecting section for detecting a predetermined relative moving distance between the tool and the pressure piece;
    wherein the spindle stops machining when the detecting section detects the predetermined relative moving distance.

* * * * *